US010811296B2

(12) United States Patent
Cho et al.

(10) Patent No.: US 10,811,296 B2
(45) Date of Patent: Oct. 20, 2020

(54) SUBSTRATE SUPPORT WITH DUAL EMBEDDED ELECTRODES

(71) Applicant: Applied Materials, Inc., Santa Clara, CA (US)

(72) Inventors: Jaeyong Cho, San Jose, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 15/710,700

(22) Filed: Sep. 20, 2017

(65) Prior Publication Data
US 2019/0088519 A1 Mar. 21, 2019

(51) Int. Cl.
H01L 21/683 (2006.01)
H01L 21/311 (2006.01)
H01L 21/67 (2006.01)
H01J 37/32 (2006.01)
H01L 21/687 (2006.01)

(52) U.S. Cl.
CPC ...... *H01L 21/6833* (2013.01); *H01J 37/3255* (2013.01); *H01J 37/32706* (2013.01); *H01J 37/32715* (2013.01); *H01L 21/31116* (2013.01); *H01L 21/67069* (2013.01); *H01L 21/67103* (2013.01); *H01L 21/68757* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 4,340,462 A | 7/1982 | Koch | |
| 5,770,023 A | 6/1998 | Sellers | |
| 6,051,114 A | 4/2000 | Yao et al. | |
| 6,187,685 B1 | 2/2001 | Hopkins et al. | |
| 6,201,208 B1 | 3/2001 | Wendt et al. | |
| 6,253,704 B1 | 7/2001 | Savas | |
| 6,863,020 B2 | 3/2005 | Mitrovic et al. | |
| 7,126,808 B2 | 10/2006 | Koo et al. | |
| 7,601,246 B2 | 10/2009 | Kim et al. | |
| 7,718,538 B2 | 5/2010 | Kim et al. | |
| 7,888,240 B2 | 2/2011 | Hamamjy et al. | |
| 8,382,999 B2 | 2/2013 | Agarwal et al. | |
| 8,383,001 B2 | 2/2013 | Mochiki et al. | |
| 8,422,193 B2 | 4/2013 | Tao et al. | |
| 8,603,293 B2 | 12/2013 | Koshiishi et al. | |

(Continued)

FOREIGN PATENT DOCUMENTS

JP 2008-300491 A 12/2008

OTHER PUBLICATIONS

Dorf et al., U.S. Appl. No. 62/433,204, filed Dec. 12, 2016.

(Continued)

*Primary Examiner* — David P Turocy
(74) *Attorney, Agent, or Firm* — Patterson + Sheridan, LLP

(57) ABSTRACT

Embodiments described herein generally relate to plasma assisted or plasma enhanced processing chambers. More specifically, embodiments herein relate to electrostatic chucking (ESC) substrate supports configured to provide pulsed DC voltage to a substrate, and methods of biasing the substrate using the pulsed DC voltage, during plasma assisted or plasma enhanced semiconductor manufacturing processes.

15 Claims, 4 Drawing Sheets

(56) References Cited

U.S. PATENT DOCUMENTS

| | | | |
|---|---|---|---|
| 8,828,883 | B2 | 9/2014 | Rueger |
| 8,916,056 | B2 | 12/2014 | Koo et al. |
| 8,926,850 | B2 | 1/2015 | Singh et al. |
| 9,101,038 | B2 | 8/2015 | Singh et al. |
| 9,105,452 | B2 | 8/2015 | Jeon et al. |
| 9,150,960 | B2 | 10/2015 | Nauman et al. |
| 9,490,107 | B2 | 11/2016 | Kim et al. |
| 9,583,357 | B1 | 2/2017 | Long et al. |
| 9,601,319 | B1 | 3/2017 | Bravo et al. |
| 9,620,376 | B2 | 4/2017 | Kamp et al. |
| 9,761,459 | B2 | 9/2017 | Long et al. |
| 9,852,889 | B1 | 12/2017 | Kellogg et al. |
| 9,881,820 | B2 | 1/2018 | Wong et al. |
| 2001/0003298 | A1* | 6/2001 | Shamouilian ....... H01L 21/6831 156/345.43 |
| 2003/0026060 | A1* | 2/2003 | Hiramatsu ............. H05B 3/265 361/311 |
| 2004/0066601 | A1* | 4/2004 | Larsen ................... H02N 13/00 361/234 |
| 2007/0196977 | A1 | 8/2007 | Wang et al. |
| 2008/0037196 | A1* | 2/2008 | Yonekura ............ H01L 21/6831 361/234 |
| 2008/0135401 | A1 | 6/2008 | Kadlec et al. |
| 2008/0289576 | A1 | 11/2008 | Lee et al. |
| 2010/0072172 | A1 | 3/2010 | Ui et al. |
| 2010/0193491 | A1 | 8/2010 | Cho et al. |
| 2011/0096461 | A1* | 4/2011 | Yoshikawa ......... H01L 21/6833 361/234 |
| 2011/0281438 | A1 | 11/2011 | Lee et al. |
| 2012/0000421 | A1 | 1/2012 | Miller et al. |
| 2012/0088371 | A1 | 4/2012 | Ranjan et al. |
| 2012/0097908 | A1* | 4/2012 | Willwerth ......... H01L 21/68742 254/93 R |
| 2013/0213935 | A1* | 8/2013 | Liao .................. H01J 37/32165 216/71 |
| 2014/0154819 | A1 | 6/2014 | Gaff et al. |
| 2014/0177123 | A1* | 6/2014 | Thach ............... H01L 21/67109 361/234 |
| 2014/0262755 | A1 | 9/2014 | Deshmukh et al. |
| 2014/0263182 | A1 | 9/2014 | Chen et al. |
| 2015/0043123 | A1 | 2/2015 | Cox |
| 2015/0170952 | A1* | 6/2015 | Subramani ............. H02N 13/00 361/234 |
| 2017/0011887 | A1 | 1/2017 | Deshmukh et al. |
| 2017/0018411 | A1 | 1/2017 | Sriraman et al. |
| 2017/0069462 | A1 | 3/2017 | Kanarik et al. |
| 2017/0110335 | A1 | 4/2017 | Yang et al. |
| 2017/0113355 | A1 | 4/2017 | Genetti et al. |
| 2017/0115657 | A1 | 4/2017 | Trussell et al. |
| 2017/0117172 | A1 | 4/2017 | Genetti et al. |
| 2017/0178917 | A1 | 6/2017 | Kamp et al. |
| 2017/0236688 | A1 | 8/2017 | Caron et al. |
| 2017/0236741 | A1 | 8/2017 | Angelov et al. |
| 2017/0236743 | A1 | 8/2017 | Severson et al. |
| 2017/0250056 | A1 | 8/2017 | Boswell et al. |
| 2017/0263478 | A1 | 9/2017 | McChesney et al. |
| 2017/0316935 | A1 | 11/2017 | Tan et al. |
| 2017/0330786 | A1 | 11/2017 | Genetti et al. |
| 2017/0334074 | A1 | 11/2017 | Genetti et al. |
| 2017/0372912 | A1 | 12/2017 | Long et al. |

OTHER PUBLICATIONS

Koh et al., U.S. Appl. No. 15/424,405, filed Feb. 3, 2017.

Dorf et al., U.S. Appl. No. 15/618,082, filed Jun. 8, 2017.

Wang, S.B., et al.—"Control of ion energy distribution at substrates during plasma processing," Journal of Applied Physics, vol. 88, No. 2, Jul. 15, 2000, pp. 643-646.

PCT International Search Report and Written Opinion dated Nov. 7, 2018, for International Application No. PCT/US2018/042961.

* cited by examiner

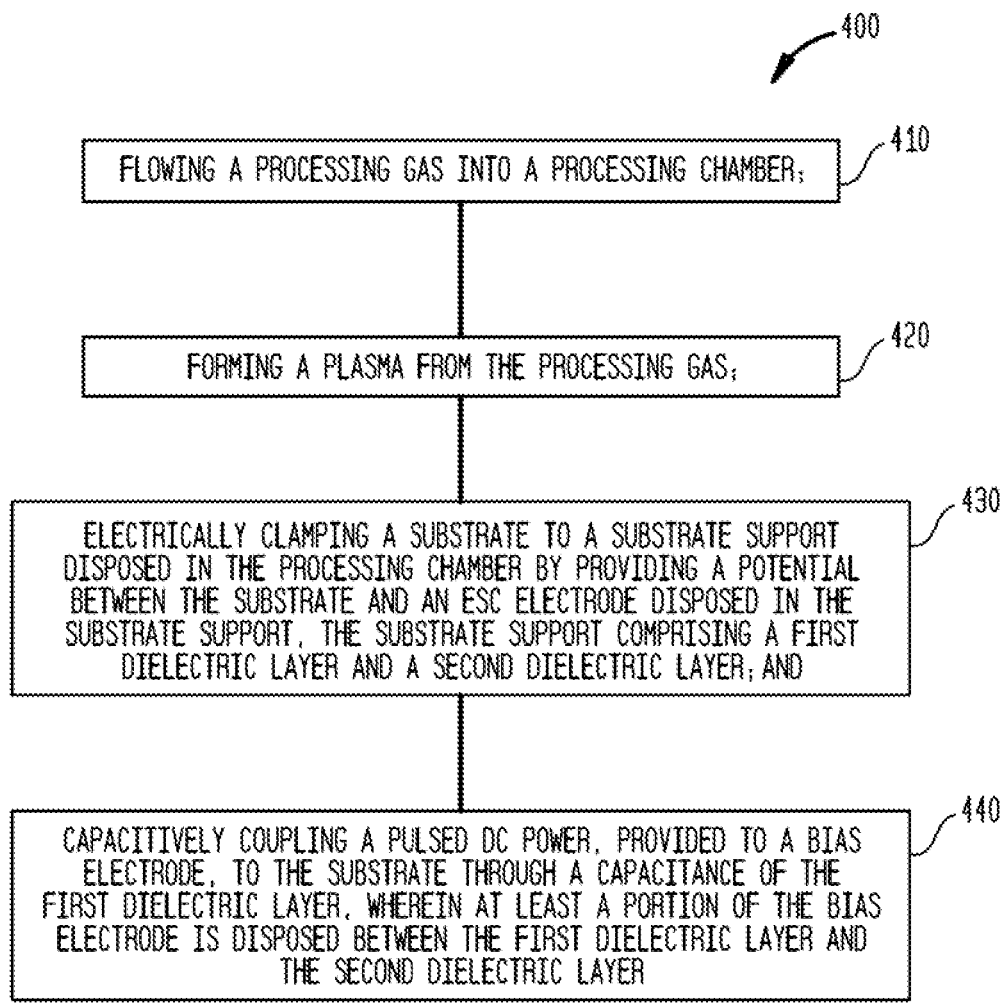

SUBSTRATE SUPPORT WITH DUAL EMBEDDED ELECTRODES

BACKGROUND

Field

Embodiments described herein generally relate to processing chambers used in semiconductor manufacturing, in particular, to processing chambers having a substrate support assembly configured to bias a substrate disposed thereon, and methods of biasing the substrate.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process to form high aspect ratio openings in a material layer, such as a dielectric layer, of a substrate. In a typical plasma assisted etching process, a plasma is formed in the processing chamber and ions from the plasma are accelerated towards the substrate, and openings formed in a mask thereon, to form openings in a material layer beneath the mask surface. Typically, the ions are accelerated towards the substrate by coupling a low frequency RF power in the range of 400 kHz to 2 MHz to the substrate thereby creating a bias voltage thereon. However, coupling an RF power to the substrate does not apply a single voltage to the substrate relative to the plasma. In commonly used configurations, the potential difference between the substrate and the plasma oscillates from a near zero value to a maximum negative value at the frequency of the RF power. The lack of a single potential, accelerating ions from the plasma to the substrate, results in a large range of ion energies at the substrate surface and in the openings (features) being formed in the material layers thereof. In addition, the disparate ion trajectories that result from RF biasing produce large angular distributions of the ions relative to the substrate surface. Large ranges of ion energies are undesirable when etching the openings of high aspect ratio features as the ions do not reach the bottom of the features with sufficiently high energies to maintain desirable etch rates. Large angular distributions of ions relative to the substrate surface are undesirable as they lead to deformations of the feature profiles, such as necking and bowing in the vertical sidewalls thereof.

Accordingly, there is a need in the art for the ability to provide narrow ranges of high energy ions with narrow angular distributions at the material surface of a substrate during a plasma assisted etching process.

SUMMARY

The present disclosure generally relates to plasma assisted or plasma enhanced processing chambers. More specifically, embodiments herein relate to electrostatic chucking (ESC) substrate supports configured to provide pulsed DC voltage to a substrate during plasma assisted or plasma enhanced semiconductor manufacturing processes and methods of biasing the substrate.

In one embodiment, a substrate support assembly is provided. The substrate support assembly includes a substrate support comprising a first dielectric layer, for supporting a substrate, disposed on a second dielectric layer, a first electrode, disposed between the first dielectric layer and the second dielectric layer, for capacitively coupling a pulsed DC power to the substrate through a capacitance of the first dielectric layer, and a second electrode, for electrically clamping the substrate to the substrate support by providing a potential between the substrate and the second electrode, wherein the second electrode is electrically isolated from the first electrode. In one embodiment, the bias electrode and the ESC electrode are planarly disposed with each other in the substrate support. In another embodiment, the bias electrode is closer to a substrate support surface than the ESC electrode. In another embodiment, the bias electrode includes a planar portion, a plurality of conductive features between the planar portion and the substrate support surface, and a plurality of connectors electrically coupling the planar portion to the plurality of conductive features. Both the planar portion and the plurality of conductive features of the bias electrode provide a pulsed DC bias to the substrate through capacitive coupling therewith. In this embodiment, the plurality of connectors is closer to the substrate support surface than the ESC electrode.

In another embodiment, a method of biasing a substrate with a pulsed DC voltage is provided. The method includes flowing a processing gas into the processing chamber, forming a plasma from the processing gas, and electrically clamping a substrate to a substrate support disposed in a processing chamber by providing a potential between the substrate and a first electrode disposed in the substrate support. Herein, the substrate support comprises a first dielectric layer and a second dielectric layer. The method further includes capacitively coupling a pulsed DC power, provided to a second electrode, to the substrate through a capacitance of the first dielectric layer, wherein at least a portion of the second electrode is disposed between the first dielectric layer and the second dielectric layer.

In another embodiment, a processing chamber is provided. The processing chamber includes one or more sidewalls and a bottom defining a processing volume and a substrate support assembly disposed in the processing volume. The substrate support assembly comprises a cooling base formed of a thermally conductive material, a substrate support thermally coupled to the cooling base, the substrate support comprising a first layer of dielectric material and a second layer of dielectric material. The substrate support assembly further comprises a first electrode disposed between the first layer of dielectric material and the second layer of dielectric material for capacitively coupling a pulsed DC power to a substrate through a capacitance the first layer of dielectric material and a second electrode for electrically clamping the substrate to the substrate support by providing a potential between the substrate and the second electrode. Herein the second electrode is electrically isolated from the first electrode. In some embodiments, the processing chamber further includes a plasma generating apparatus comprising a capacitively coupled plasma (CCP) source or an inductively coupled plasma (ICP) source electrically coupled to an RF power supply. For example, in one embodiment the plasma generating apparatus comprises a plasma electrode disposed in the processing volume and facing the substrate support, and a power conduit configured to electrically couple the plasma electrode to an RF power supply. In other embodiments, the plasma generating apparatus comprises a microwave plasma source, such as an electron cyclotron resonance plasma (ECR) source or a linear microwave plasma source (LPS), and a power conduit configured to electrically couple the microwave plasma source to a microwave power supply.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a flow diagram illustrating a method of biasing a substrate during a plasma assisted process, according to embodiments described herein.

DETAILED DESCRIPTION

Embodiments described herein generally relate to plasma assisted or plasma enhanced processing chambers. More specifically, embodiments herein relate to electrostatic chucking (ESC) substrate supports configured to provide a pulsed DC voltage to a substrate, and methods of biasing the substrate using the pulsed DC voltage, during plasma assisted or plasma enhanced semiconductor manufacturing processes. Capacitive coupling of the substrate to a pulsed DC power source (placing a pulsed DC bias on the substrate) increases the potential difference between the substrate and a plasma formed in the processing chamber thereby accelerating ions from the plasma towards the active surface of the substrate.

Figure 1:
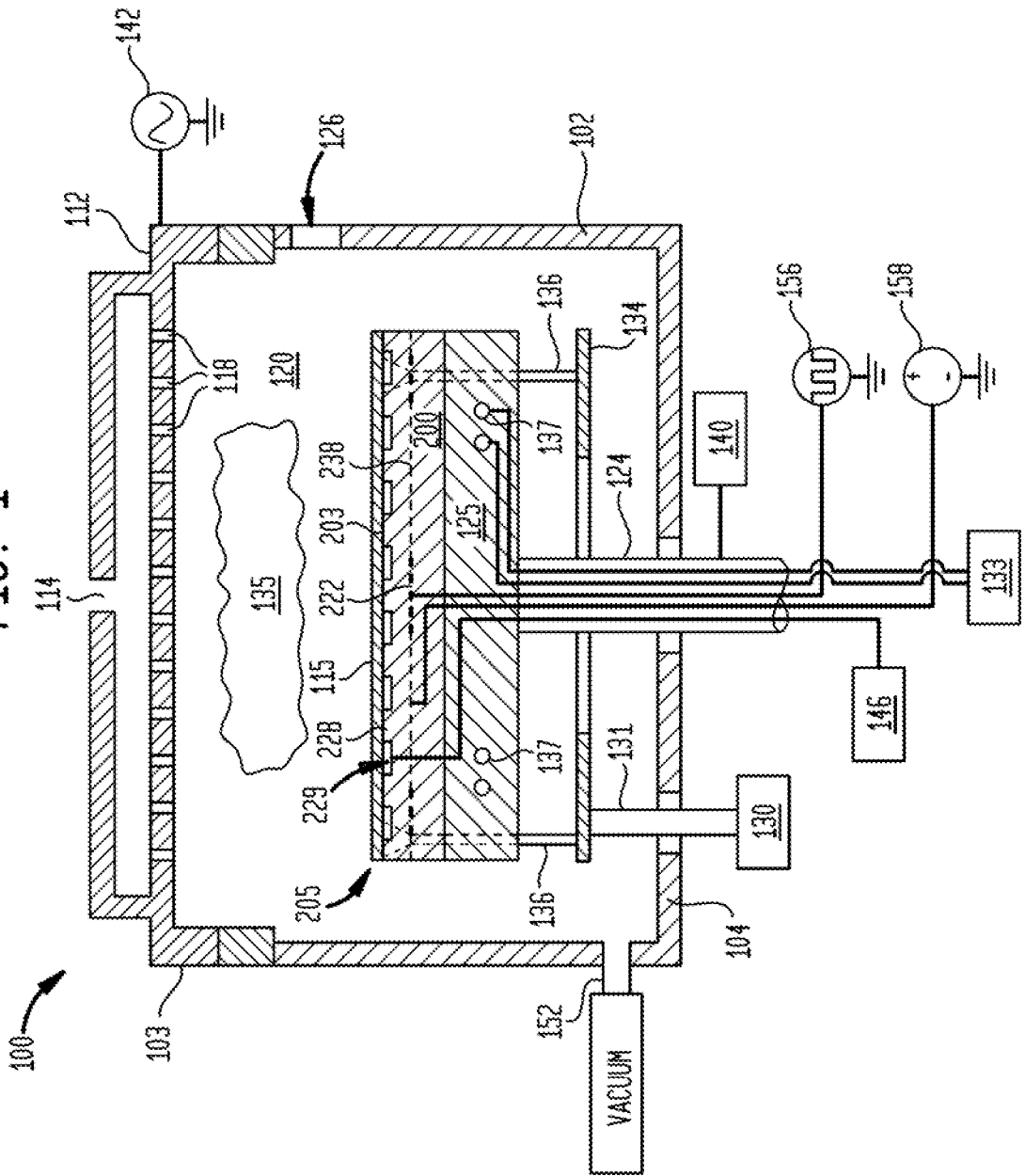
FIG. 1 is a schematic sectional view of a processing chamber having an electrostatic chucking (ESC) substrate support with dual embedded electrodes disposed therein, according to one embodiment.

FIG. 1 is a schematic sectional view of a processing chamber 100 having an electrostatic chucking (ESC) substrate support assembly 205 with dual embedded electrodes disposed therein, according to one embodiment. In this embodiment, the processing chamber 100 is a plasma processing chamber, such as a plasma etch chamber, a plasma-enhanced deposition chamber, for example a plasma-enhanced chemical vapor deposition (PECVD) chamber or a plasma-enhanced atomic layer deposition (PEALD) chamber, a plasma treatment chamber, or a plasma based ion implant chamber, for example a plasma doping (PLAD) chamber, The processing chamber 100 features a chamber lid 103, one or more sidewalls 102, and a chamber bottom 104 which define a processing volume 120. A showerhead 112, having a plurality of openings 118 disposed therethrough, is disposed in the chamber lid 103 and is used to uniformly distribute processing gases from a gas inlet 114 into the processing volume 120. The showerhead 112 is coupled to an RF power supply 142, or in some embodiments a VHF power supply, which ignites a plasma 135 from the processing gases through capacitive coupling therewith. The processing volume 120 is fluidly coupled to a vacuum source, such as to one or more dedicated vacuum pumps, through a vacuum outlet 152 which maintains the processing volume 120 at sub-atmospheric conditions and evacuates processing, and other gases, therefrom. A substrate support assembly 205, disposed in the processing volume 120 is coupled to a support shaft 124 sealingly extending through the chamber bottom 104. The support shaft 124 is coupled to a first actuator 140 that raises and lowers the support shaft 124, and the substrate support assembly 205 disposed thereon, to facilitate processing of the substrate 115 and transfer of the substrate 115 to and from the processing chamber 100. Typically, when the substrate support assembly 205 is in a raised or processing position, the substrate 115 is spaced apart from the showerhead 112 between about 0.2 inches and 2.0 inches, such as about 1.25 inches.

The substrate 115 is loaded into the processing volume 120 through a transfer opening 126 in one of the one or more sidewalls 102, which is conventionally sealed with a or door or a valve (not shown) during substrate 115 processing. A plurality of lift pins 136 disposed above a lift pin hoop 134 are movable disposed through the substrate support assembly 205 to facilitate transferring of the substrate 115 thereto and therefrom. The lift pin hoop 134 is coupled to a lift hoop shaft 131 sealingly extending through the chamber bottom 104, which raises and lowers the lift pin hoop 134 by means of a second actuator 130. When the lift pin hoop 134 is in a raised position, the plurality of lift pins 136 extend above the surface of the substrate support assembly 205 lifting the substrate 115 therefrom and enabling access to the substrate 115 by a robot handler. When the lift pin hoop 134 is in a lowered position the plurality of lift pins 136 are flush with, or below, the surface of the substrate support assembly 205 and the substrate 115 rests directly on a substrate support surface 203 for processing.

The substrate support assembly 205 herein includes a cooling base 125 and a substrate support 200 thermally coupled to, and disposed on, the cooling base 125. The cooling base 125 of the substrate support assembly 205 herein is used to regulate the temperature of the substrate support 200, and thereby the substrate 115 disposed on the substrate support surface 203, during processing. Herein, the cooling base 125 includes one or more fluid conduits 137 disposed therein that are fluidly coupled to, and in fluid communication with, a coolant source 133, such as a refrigerant source or water source. Typically, the cooling base 125 is formed of a corrosion resistant thermally conductive material, such as a corrosion resistant metal, for example aluminum, an aluminum alloy, or stainless steel and is thermally coupled to the substrate support 200 with an adhesive or by mechanical means.

During processing, ion bombardment of the substrate 115 will heat the substrate 115. The low pressure of the processing volume 120 results in poor thermal conduction between the substrate 115 and the substrate support surface 203. Therefore, in embodiments herein, a backside gas is provided to a gap 229 between the substrate 115 and recessed portions of the substrate support surface 203 during processing, where the backside gas thermally couples the substrate 115 to the substrate support surface 203 and increases the heat transfer therebetween. Typically, the substrate support surface 203 includes a plurality of mesas 228 extending therefrom that enable the backside side gas to flow into the gap 229 between the substrate 115 and the substrate support surface 203 when the substrate 115 is disposed thereon. The backside gas flows to the substrate support surface 203, and the gap 229 disposed between recessed portions of the substrate support surface 203 and a substrate 115 disposed thereon, through one or more gas conduits 147 disposed through the substrate support 200. Herein, the one or more gas conduits 147 are coupled to thermally conductive inert backside gas source 146, such as a Helium gas source.

Figure 2A:
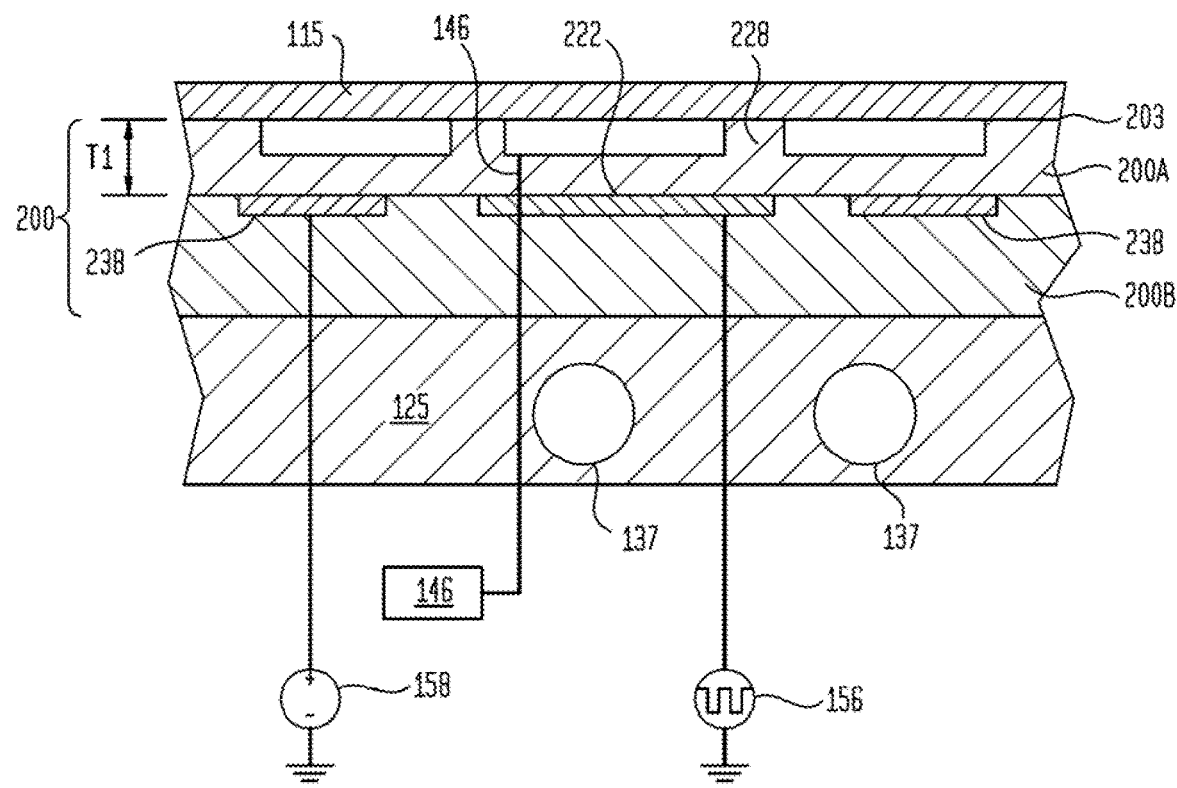
FIG. 2A is a close up sectional view of a portion of the substrate support assembly used in the processing chamber shown in FIG. 1.
Figure 2B:
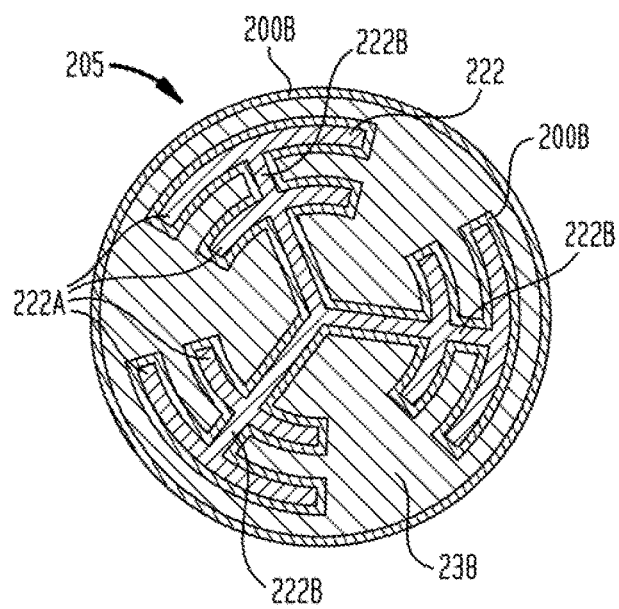
FIG. 2B is a top down sectional view of a substrate support assembly, according to one embodiment.
Figure 2C:
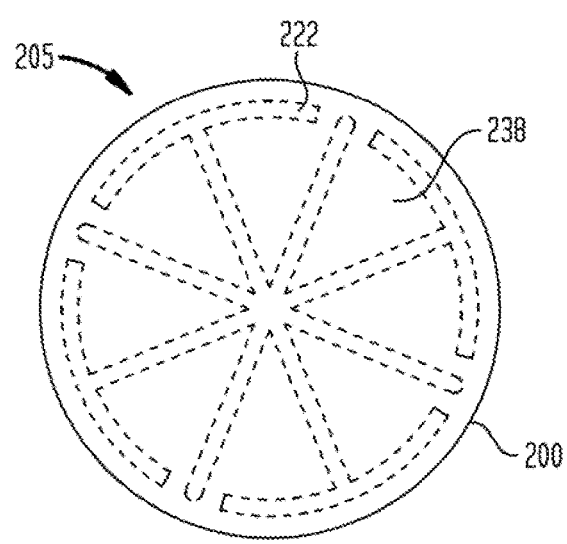
FIG. 2C is a top down view of a substrate support assembly, according to another embodiment.

FIG. 2A is a close up sectional view of a portion of the substrate support assembly 205 used in the processing chamber 100. FIG. 2B is a top down sectional view of electrodes embedded the dielectric material of a substrate support assembly 205, according to one embodiment. The plurality of lift pins 136 are not shown in FIG. 2B. FIG. 2C is a top down view of a substrate support 200, according to another embodiment. The substrate support 200 comprises a first layer 200A and a second layer 200B where each layer 200A and 200B is formed from a dielectric material comprising a metal oxide or metal nitride, or a dielectric material comprising a mixture of metal oxides or metal nitrides, such as $Al_2O_3$, AlN, $Y_2O_3$, or combinations thereof. In one embodiment, the first layer 200A is formed of 99.5% alumina having a breakdown voltage of 9 kV at 160 μm. Herein, the substrate support 200 is formed by bonding a bulk dielectric material to the second layer 200B, and a plurality of electrodes disposed therein or thereon, and grinding the bulk dielectric material to a desired thickness $T_1$ thereby forming the first layer 200A. Typically, the first layer 200A has a thickness $T_1$ between about 100 μm and about 300 μm, for example about 160 μm. In other embodiments, the first layer 200A is formed using any suitable coating method, such as CVD, PECVD, ALD, PEALD, evaporation, sputtering, reactive evaporation, reactive sputtering, plasma arc coating, aerosol coating, or combinations thereof.

The plurality of electrodes includes a first electrode 222 (a bias electrode), for capacitively coupling the substrate 115 to a first power source 156, and a second electrode 238, for electrically clamping the substrate 115 to the substrate support 200. Each of the electrodes 222 and 238 is formed of one or more electrically conductive material parts, such as a metal mesh, foil, plate, or combinations thereof. In some embodiments, the first electrode 222 is formed of a more than one discontinuous electrically conductive material parts, such as a plurality of metal meshes, foils, plates, or combinations thereof, that are electrically coupled with one or more connectors so that the discontinuous material parts comprise a single electrode. In some embodiments, the second electrode 238 is formed of more than one discontinuous electrically conductive material parts electrically coupled with one or more connectors to comprise a single electrode. In embodiments herein, electrodes 222 and 238 are formed, either simultaneously or sequentially, by depositing a conducting layer; deposition methods include CVD, PECVD, ALD, PEALD, evaporation, sputtering, plasma arc coating, aerosol coating, electroplating, or combinations thereof, or any suitable coating method. In FIGS. 2A and 2B, the first electrode 222 and the second electrode 238 are planarly disposed on or are embedded in the dielectric material of the second layer 200B of the substrate support 200. In FIG. 2B the first electrode and the second electrode are arranged in an interdigitated structure. The first electrode 222 comprises a plurality of azimuthal portions 222A at multiple radiuses from the center of the substrate support 200 and a plurality of radial portions 222B contacting the plurality of azimuthal portions 222A. Herein, the radial portions 222B are of the same length and the plurality of azimuthal portions 222A are concentrically disposed about the center of the substrate support 200. In other embodiments, the first electrode 222 may have any combination of lengths and/or arrangement of azimuthal portions 222A and/or radial portions 222B. In FIG. 2B, the first electrode 222 is formed of a single material part or a plurality of electrically coupled material parts. The second electrode 238 comprises a unitary mesh and is electrically isolated from the first electrode 222 by openings formed therein and dielectric material of the second layer 200B disposed therebetween. Typically, a ratio of the surface area of the second electrode 238 to the surface area of the first electrode 222 is greater than about 80:10, such as greater than about 90:10, or for example about 90:10. In other embodiments, the first electrode 222, or a portion thereof, is closer to the substrate support surface 203 than the second electrode 238.

FIG. 2C is a top down view of a substrate support assembly 205, according to another embodiment. In FIG. 2C the first electrode 222 is disposed in a plane between the second electrode (not shown) and the surface of the substrate support 200. The first electrode 222 comprises a unitary material part having a plurality of azimuthal portions 222A connected to zero or one or more of a plurality of radial portions 222B.

Herein, the first power source 156 provides a high voltage (HV) pulsed DC power to the first electrode 222 of between about 0 kV and about 10 kV at a frequency of between about 10 Hz and about 100 kHZ, such as between about 500 Hz and about 50 kHZ. The pulsed DC power is capacitively coupled to the substrate through the capacitance of the first layer 200A of the substrate support 200. The second electrode 238, which provides a clamping force between the substrate 115 and the substrate support surface 203 by providing a potential therebetween, is electrically coupled to a second power source 158, herein a static DC power supply, which provides between about −5000 V and about 5000 V.

Figure 3A:
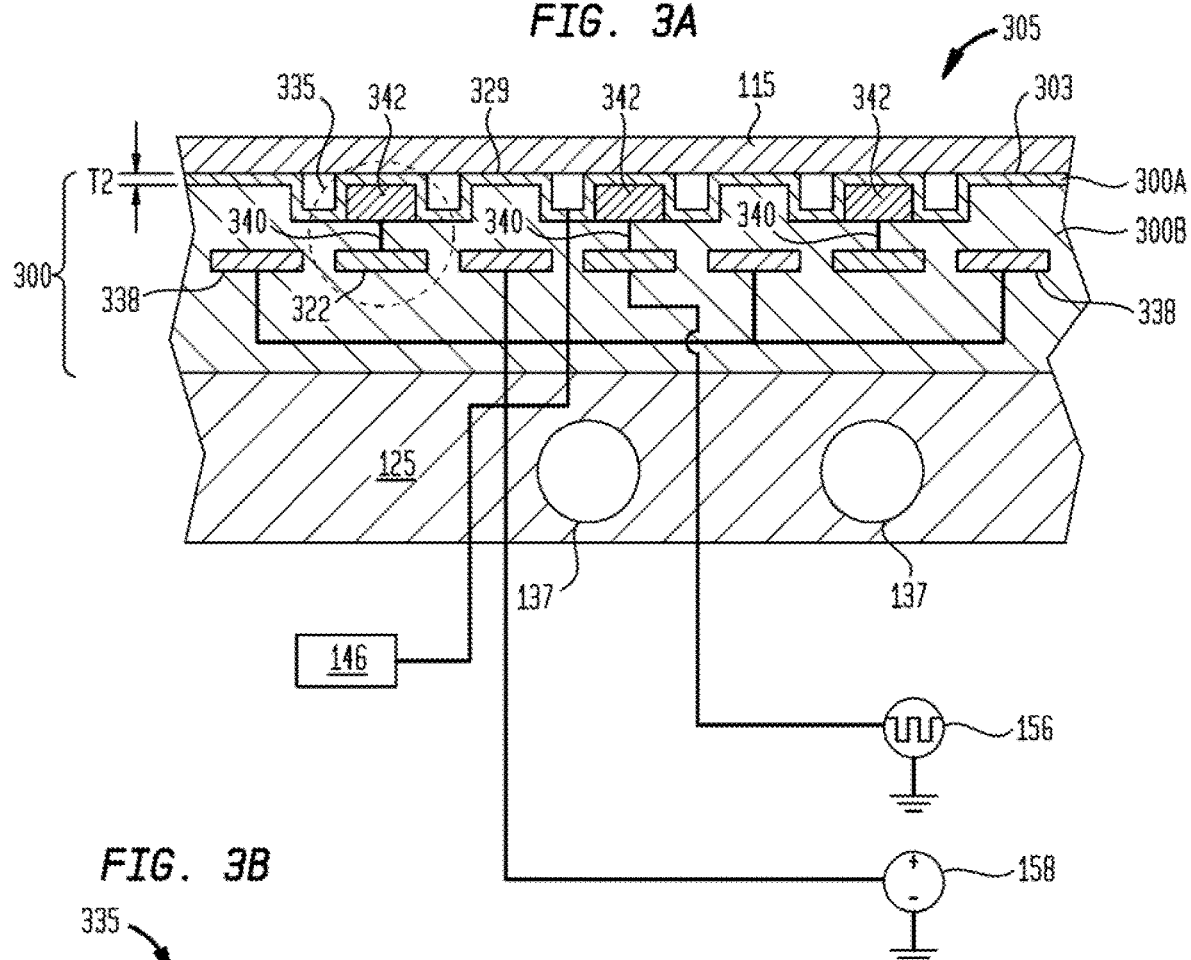
FIG. 3A is a close up sectional view of a portion of a substrate support assembly, according to another embodiment.
Figure 3B:
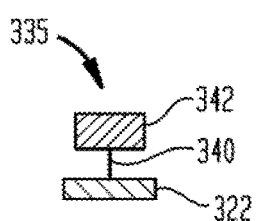
FIG. 3B is shows a portion of the bias electrode shown in FIG. 3A.

FIG. 3A is a close up sectional view of a portion of a substrate support assembly 305, according to another embodiment. FIG. 3B is shows a portion of a first electrode 335 (bias electrode) shown in FIG. 3A. The substrate support assembly 305 includes a cooling base 125 and a substrate support 300 thermally coupled to, and disposed on, the cooling base 125. The substrate support 300 includes a plurality of electrodes disposed therein, a sub-surface layer 300B, and a surface layer 300A disposed on the sub-surface layer 300B. The plurality of electrodes includes a first electrode 335 (bias electrode), for capacitively coupling the substrate 115 to a first power source 156, and a second electrode 338 for electrically clamping the substrate 115 to the substrate support 300 with the second power source 158.

The surface layer 300A comprises a dielectric coating, such as $Al_2O_3$, AlN, $Y_2O_3$, or combinations thereof, formed over the sub-surface layer 300B and a plurality of conductive features 342 disposed thereon. The first electrode 335 includes a planar portion 322, a plurality of conductive features 342 disposed between the planar portion 322 and the surface layer 300A, and a plurality of connectors 340 electrically coupling the planar portion 322 to the plurality of conductive features 342. The second electrode 338 is electrically isolated from the first electrode 335 and planarly disposed with the planar portion 322 thereof. Herein, the planar portion 322 of the first electrode 335 and the second electrode 338 are each formed of one or more electrically conductive material parts such as metal meshes, foils, plates, or combinations thereof. In some embodiments, electrodes and portions of electrodes 322, 338, and 342 are formed, either simultaneously or sequentially, by depositing a conducting layer; deposition methods include CVD, PECVD, ALD, PEALD, evaporation, sputtering, plasma arc coating, aerosol coating, electroplating, or combinations thereof, or any suitable coating method. The planar portion 322 of the first electrode 335 is formed of a continuous electrically conductive material and the second electrode 338 is formed of a more than one discontinuous electrically conductive material parts electrically coupled to one another by one or more electrical connectors. In other embodiments, the planar portion 322 of the first electrode 335 and the second electrode 338 are each formed of continuous electrically conductive material parts and are electrically isolated from each other by interdigitating of the structures thereof, such as the interdigitated structure shown in FIG. 2B. In other embodiments, the second electrode 338 is formed of a continuous electrically conductive material and the planar portion 322 of the first electrode 335 is formed of more than one discontinuous electrically conductive material parts electrically coupled to one another by one or more electrical connectors. In other embodiments, the planar portion 322 of the first electrode 335 is closer to the substrate support surface 303 than the second electrode 338. In some embodiments, the planar portion 322 of the first electrode 335 is spaced apart from the substrate support surface 303 by one or more dielectric layers therebetween having a combined thickness of between about 100 μm and about 300 μm, such as about 160 μm.

The plurality of conductive features 342 and the plurality of connectors 340 are formed of an electrically conductive material, such as a metal. For example, in one embodiment the plurality of conductive features 342 are formed of titanium deposited using a physical vapor deposition (PVD) method and having a thickness of between about 5 μm and about 15 μm, such as about 10 μm and the plurality of connectors 340 are formed of aluminum. Herein, the plurality of conductive features 342 are spaced apart from the substrate support surface 303 by the coating thickness $T_2$ of the surface layer 300A.

Typically, the sub-surface layer 300B and/or the surface layer 300A comprise dielectric materials and are each formed of a metal oxide or metal nitride, or a dielectric material comprising a mixture of metal oxides or metal nitrides, such as $Al_2O_3$, AlN, $Y_2O_3$, or combinations thereof. The dielectric coating of the surface layer 300A is deposited using any suitable coating method, such as CVD, PECVD, ALD, PEALD, evaporation, sputtering, reactive evaporation, reactive sputtering, plasma arc coating, aerosol coating, or combinations thereof. The coating thickness $T_2$ of the surface layer 300A is between about 2 μm and about 200 μm, such as between about 5 μm and about 100 μm. In some embodiments, the surface layer 300A is formed by aerosol coating the sub-surface layer 300B, and the plurality of conductive features 342 disposed thereon, with $Al_2O_3$ having a coating thickness $T_2$ of about 10 μm, about 30 μm, or about 100 μm. In some embodiments, the dielectric material of the surface layer 300A has a breakdown voltage of between about 100 V/μm and about 200 V/μm.

Figure 3C:
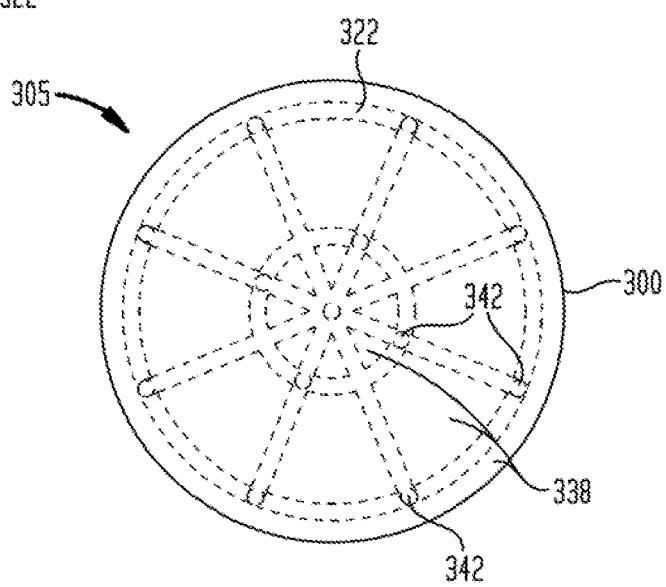
FIG. 3C a top down view of a substrate support assembly, according to another embodiment.

FIG. 3C is a top down view of a substrate support assembly, according to another embodiment. In FIG. 3C the planar portion 322 of the first electrode 335 is disposed in a plane between the second electrode (not shown) and the surface of the substrate support 300. The planar portion 322 herein comprises a unitary material part having a plurality of azimuthal portion 322A, each azimuthal portion 322A comprising an annulus connected to a plurality of radial portions 322B extending to and/or through a radius thereof.

FIG. 4 is a flow diagram illustrating a method 400 of biasing a substrate during a plasma assisted process, according to embodiments described herein. The method 400 at 410 includes flowing a processing gas into the processing chamber and at 420 includes forming a plasma from the processing gas.

The method 400 at 430 includes electrically clamping the substrate to a substrate support disposed in the processing chamber, such as the substrate support 200 described in FIGS. 2A-2B or the substrate support 300 described in FIGS. 3A-3B. Electrically clamping the substrate to the substrate support comprises providing a potential between the substrate and an electrostatic chucking (ESC) electrode disposed in the substrate support. Typically, the ESC is coupled to a DC power supply which, herein, provides between about −5000 V and about +5000 V, such as between about 500 V and about 4500 V, such as between about 1000 V and about 3000 V, for example about 2500V.

The method 400 at 440 includes biasing the substrate by capacitively coupling a pulsed DC power, provided to a bias electrode from a pulsed DC power supply, to the substrate through a capacitance of a first dielectric layer of the substrate support. In some embodiments, the substrate is biased before or concurrently with flowing the processing gas into the processing chamber at activity 420 and/or forming a plasma from the processing gas at activity 430. Herein, the bias electrode, or a portion thereof, is planarly disposed with the ESC electrode between the first dielectric layer and a second dielectric layer of the substrate support. Typically, the pulsed DC power supply provides a high voltage (HV) pulsed DC power to the bias electrode of between about 0 kV and about 10 kV at a frequency of between about 10 Hz and about 100 kHZ. In other embodiments, the bias electrode, or a portion thereof, is closer to the substrate support surface than the ESC electrode. It should be noted that the plasma may also be formed after operation 420, after operation 430, or after operation 440.

The substrate support assemblies and methods described herein enable capacitively coupled pulsed DC biasing of a substrate during plasma assisted processing that is compatible with use of an electrostatic clamping force. Pulsed DC biasing allows for increased control of ion energy and angular distribution at the substrate surface and in feature openings formed therein. This increased control is desirable at least in forming high aspect ratio features and/or features requiring a straight etch profile, such as high aspect ratio etching in dielectric materials for memory devices such as non-volatile flash memory devices and dynamic random access memory devices; such as in silicon etch for shallow trench isolation (STI) applications; and such as for silicon fins used in FinFET devices.

While the foregoing is directed to embodiments of the present disclosure, other and further embodiments of the disclosure may be devised without departing from the basic scope thereof, and the scope thereof is determined by the claims that follow.

The invention claimed is:
1. A substrate support assembly, comprising:
   a substrate support, comprising;
      a first dielectric layer, for supporting a substrate, disposed on a second dielectric layer;
      a first electrode comprising a planar lower portion, a plurality of conductive features and a plurality of connectors connecting a top surface of the planar lower portion to a bottom surface of the plurality of conductive features, the planar lower portion disposed within the second dielectric layer and the plurality of conductive features disposed at the surface of the second dielectric layer and between the first dielectric layer and the second dielectric layer, the first electrode for capacitively coupling a first power source to the substrate through a capacitance of the first dielectric layer, wherein the first power source is a pulsed DC power supply; and a second electrode for electrical coupling to a second power source, for electrically clamping the substrate to the substrate support by providing a potential between the substrate and the second electrode, wherein the second electrode is electrically isolated from the first electrode and the second power source is a DC power supply; wherein the planar lower portion of the first electrode and the second electrode are coplanar.

2. The substrate support of claim 1, wherein a ratio of a first surface area of the first electrode to a second surface area of the second electrode is less than about 80 to 10.

3. The substrate support of claim 2, wherein the first dielectric layer is disposed between at least a portion of the first electrode and a substrate support surface and has a thickness of between about 2 μm and about 200 μm.

4. The substrate support of claim 1, wherein the first electrode and the second electrode have an interdigitated structure.

5. The substrate support of claim 1, wherein the at least a portion of the first electrode is closer to a substrate support surface than the second electrode.

6. The substrate support of claim 1, wherein the first dielectric layer comprises a dielectric coating formed over the second dielectric layer.

7. The substrate support of claim 6, wherein the dielectric coating consists of $Al_2O_3$, AlN, $Y_2O_3$, or combinations thereof.

8. The substrate support of claim 6, wherein the plurality of conductive features is formed of Titanium.

9. The substrate support of claim 1, wherein the first layer of dielectric material has a thickness of between about 5 μm and about 200 μm.

10. The substrate support of claim 1, wherein the first layer of dielectric material has a breakdown voltage of between about 100 V/μm and about 200 V/μm.

11. The substrate support assembly of claim 1, further comprising a cooling base thermally coupled to the substrate support.

12. A processing chamber, comprising:
one or more sidewalls and a bottom defining a processing volume; and
a substrate support assembly disposed in the processing volume, comprising:
a cooling base formed of a thermally conductive material;
a substrate support thermally coupled to the cooling base, the substrate support comprising a first layer of dielectric material and a second layer of dielectric material;
a first electrode comprising a planar lower portion, a plurality of conductive features and a plurality of connectors connecting a top surface of the planar lower portion to a bottom surface of the plurality of conductive features, the planar lower portion disposed within the second dielectric layer and the plurality of conductive features disposed at the surface of the second dielectric layer and between the first layer of dielectric material and the second layer of dielectric material, the first electrode for capacitively coupling a first power source to a substrate through a capacitance the first layer of dielectric material, wherein the first power source is a pulsed DC power supply; and
a second electrode for electrical coupling to a second power source, for electrically clamping the substrate to the substrate support by providing a potential between the substrate and the second electrode, wherein the second electrode is electrically isolated from the first electrode and the second power source is a DC power supply; wherein
the planar lower portion of the first electrode and the second electrode are coplanar.

13. The processing chamber of claim 12, wherein the first electrode and at least a portion of the second electrode are planarly disposed.

14. The processing chamber of claim 12, wherein at least a portion of the first electrode is closer to a substrate support surface than the second electrode.

15. The processing chamber of claim 12, wherein the first layer of dielectric material is disposed between the first electrode and a substrate support surface.

* * * * *